United States Patent

Taguchi et al.

[11] Patent Number: 5,840,115
[45] Date of Patent: Nov. 24, 1998

[54] SINGLE CRYSTAL GROWTH METHOD

[75] Inventors: Hiroaki Taguchi; Takashi Atami; Hisashi Furuya, all of Tokyo; Michio Kida, Omiya, all of Japan

[73] Assignee: Zag Ltd., Rosh Haayin, Israel

[21] Appl. No.: 781,818

[22] Filed: Jan. 10, 1997

[30] Foreign Application Priority Data

Jan. 12, 1996 [JP] Japan .................................. 8-004406

[51] Int. Cl.$^6$ .................................................. C30B 15/04
[52] U.S. Cl. ................................ 117/18; 117/19; 117/30; 117/31; 117/33
[58] Field of Search ................................ 117/18, 30, 31, 117/33, 213, 214, 19

[56] References Cited

U.S. PATENT DOCUMENTS 5,485,802  1/1996  Alteknüger et al. ...................... 117/14
5,488,924  2/1996  Horvath et al. .......................... 117/208
5,690,723  11/1997 Napai et al. ............................ 117/208

FOREIGN PATENT DOCUMENTS 4-305091  10/1992  Japan .

*Primary Examiner*—Felisa Garrett
*Attorney, Agent, or Firm*—Mark M. Friedman

[57] ABSTRACT

A method of growing a single crystal of semiconductor using a CZ growth technique, having a step (0<t<t1) wherein a single crystal of semiconductor is pulled while a source material is supplied continuously to maintain a constant amount of semiconductor melt, and a step (t2<t<t3) wherein the supply of source material is halted, and the single crystal of semiconductor is pulled using residual melt from the first step.

8 Claims, 5 Drawing Sheets

SINGLE CRYSTAL GROWTH METHOD

FIELD OF THE INVENTION

The present invention relates to a single crystal growth method in which a single crystal of a semiconductor is pulled from a semiconductor melt.

DESCRIPTION OF THE RELATED ART

The CZ growth technique is an example of one of the currently known techniques for growing single crystals of semiconductors such as silicon (Si) or gallium arsenide (GaAs).

The CZ growth technique is for pulling a single crystal of a semiconductor, and involves melting a semiconductor source material inside a quartz crucible to form a semiconductor melt, and then introducing a seed crystal to grow a single crystal of semiconductor from the melt.

Because this CZ growth technique (hereafter referred as normal CZ growth technique) enables simple generation of large diameter, high purity single crystals which are free from dislocation or have extremely low levels of lattice defect, it is widely used in the growing of a variety of semiconductor crystals.

However, with normal CZ growth technique, there is the problem in that since the amount of semiconductor melt reduces as the semiconductor crystal is pulled up, then owing to a segregation phenomena of the impurities, the impurity concentration changes in the pulling direction.

As a technique for avoiding this defect, the continuous CZ growth technique (hereafter abbreviated as CCZ growth technique) has been proposed.

The CCZ growth technique is one wherein a source material is continuously supplied to an initial semiconductor melt, and at the same time a predetermined amount of dopant is continuously or intermittently supplied, so that the semiconductor pulling operation is carried out with a constant amount of semiconductor melt. The technique thus gives a constant impurity concentration in the pulling direction, and hence a higher quality semiconductor crystal can be grown.

One of the improvements of the aforementioned CCZ growth technique which has been proposed, is a continuous magnetic field applied CZ technique (hereafter abbreviated as CMCZ growth technique), which employs a double crucible. With this technique, the CCZ growth technique incorporates external application of a magnetic field to the semiconductor melt inside the crucible to thus suppress convection in the semiconductor melt, thus enabling the growth of single crystals with high slip-free ratios and with extremely good control of oxygen concentration levels.

FIG. 2 shows an example of a single crystal silicon pulling apparatus which employs the CMCZ growth technique outlined above, being a figure from Japanese Patent Application, First Publication, No. Hei-4-305091. With this single crystal pulling apparatus 1, a double crucible 3, a heater 4, and a source material supply tube 5 are positioned inside a hollow gas tight chamber 2, and a magnet 6 is positioned outside the chamber 2.

The double crucible 3 comprises an approximately hemispherical outer crucible 11 made from quartz (SiO2), and an inner crucible 12 made from quartz, which is a cylindrical partition body which is fitted inside the outer crucible 11. The side wall of the inner crucible 12 contains a plurality of connecting apertures 13, which connect the area between the inner and outer crucibles, 12 and 11 respectively (the source material melting region), with the inside of the inner crucible 12 (the crystal growing region).

This double crucible 3 is mounted on a susceptor 15, which sits on a vertical shaft 14 located centrally at the lower portion of the chamber 2, and can be rotated in a horizontal plane at a specified angular velocity about the axis of the shaft 14. The semiconductor melt (the source material for the generation of single crystals of semiconductor, melted by heating) 21 is stored inside this double crucible 3.

The heater 4 heats and melts the semiconductor source material inside the crucible, and also maintains the temperature of the thus produced semiconductor melt 21. Normally resistance heating is used. The source material supply tube 5 is used to continuously inject a specified volume of semiconductor source material 22, on to the surface of the semiconductor melt between the outer crucible 11 and the inner crucible 12.

The magnet 6 is used to apply, externally, a magnetic field to the semiconductor melt 21 inside the double crucible 3, and to produce Lorentz forces in the semiconductor melt 21, thereby effecting the control of convection within the semiconductor melt 21, the control of oxygen concentration, and the suppression of surface vibration, and so on.

Examples of the source materials 22 which can be supplied through the source material supply tube 5 mentioned above include polysilicon which has been converted to flake form by crushing in a crusher, or polysilicon granules deposited from gaseous source material using thermal decomposition, with further supply, as necessary, of elemental additives known as dopants, such as boron (B) (in the case of production of p-type single crystals of silicon) and phosphorus (P) (in the case of production of n-type single crystals of silicon).

In the case of gallium arsenide (GaAs), the operation is similar as that outlined above, but in this case, the elemental additive used is either zinc (Zn) or silicon (Si).

With the single crystal pulling apparatus 1 outlined above, a seed crystal 25 is suspended from a pulling shaft 24 located above the inner crucible 12 and over the shaft axis line, and a single crystal of semiconductor 26 is grown at the upper surface of the semiconductor melt 21 around the seed crystal 25.

However with the CMCZ growth technique described above, a problem exists in that on completion of the pulling of the single crystal of semiconductor, a residual melt remains which is larger in volume than that remaining after a normal CZ growth technique process, resulting in a lowering in the utilization rate of the semiconductor source material.

The present invention takes the above factors into consideration, and aims to provide a single crystal growth method which enables an increased utilization rate of the semiconductor source material.

SUMMARY OF THE INVENTION

In one aspect of the present invention, a method of growing a single crystal semiconductor using a CZ growth technique has a first step wherein a single crystal of semiconductor is pulled while a source material is supplied continuously to maintain a constant amount of the semiconductor melt, and a second step wherein the supply of source material is halted, and a single crystal of semiconductor is pulled using residual melt from the first step.

Of course, the above method requires the completion of a pulling commencement transition step before the first step, and a pulling completion transition step after the second step.

Using this method, first, a single crystal of semiconductor is pulled with continuous supply of the source material, using the CCZ growth technique. Next, the residual melt is used as the source material melt for pulling the single crystal of semiconductor, using the normal CZ growth technique. That is, rather than completing the operation with the CCZ growth technique, which leaves a large amount of residual melt, the operation is completed with the normal CZ growth technique which leaves little residual melt, and so the final residual melt left at the completion of the pulling process is small.

In this aspect it is preferable if an intermediate transition step wherein the amount of source material being supplied is reduced by a predetermined proportion until it eventually reaches zero, is inserted between the first and second steps.

In another aspect of the present invention, the method of pulling a single crystal semiconductor using the CZ growth technique has a first step wherein a single crystal of semiconductor is pulled while source material is supplied continuously to maintain a constant amount of the semiconductor melt, and a third step for pulling the single crystal of semiconductor, which continues on from the first step with the amount of source material supplied gradually reduced to achieve, at the completion of pulling, a specified diameter portion of a single crystal of semiconductor.

Of course, this method requires the completion of a pulling commencement transition step before the first step, and a pulling completion transition step after the third step.

Using this method, first, a single crystal of semiconductor is pulled with continuous supply of the source material, using the CCZ growth technique. Next, the pulling of the single crystal of semiconductor is continued using the CCZ growth technique, while the amount of source material supplied is gradually reduced. By gradually reducing the amount of source material being supplied, the amount of the residual melt at the completion of pulling is reduced, and in addition, by reducing the amount of dopant supplied in proportion to the reduction in the amount of source material supplied, fluctuations in the concentration of impurities, caused by factors such as segregation, can be compensated for, and so the concentration of impurities can be maintained at a constant level, thus stabilizing the quality of the product.

In the first, second, third and intermediate transition steps described above it is preferable if the height of the melt surface is maintained at a constant level.

PREFERRED EMBODIMENTS OF THE PRESENT INVENTION

Below is a description of preferred embodiments of the present invention with reference to the drawings.

[First embodiment]

Figure 1A:
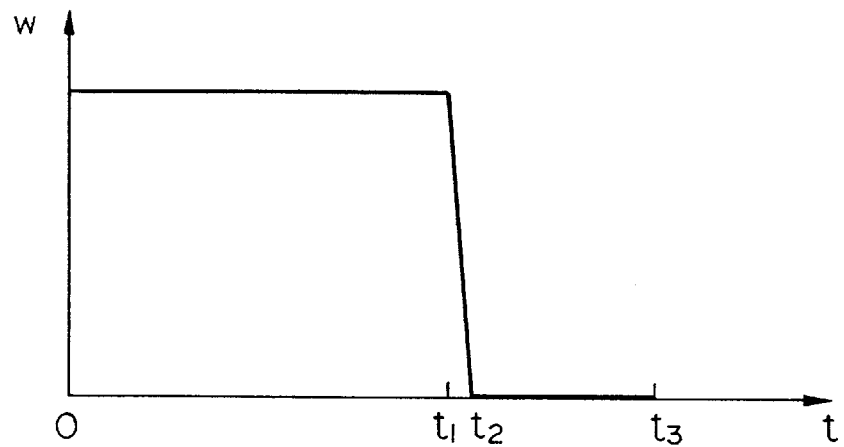
FIG. 1A and FIG. 1B are graphs showing a source material supply pattern against a time elapsed for the single crystal growth methods of the present invention, with FIG. 1A showing a source material supply pattern for a first embodiment, and FIG. 1B a source material supply pattern for a second embodiment.

FIG. 1A shows a source material supply pattern for a first embodiment of a single crystal growth method of the present invention, with the vertical axis representing an amount of source material supplied per fixed time interval (synonymous with the source material supply rate), and the horizontal axis representing elapsed time.

Figure 2:
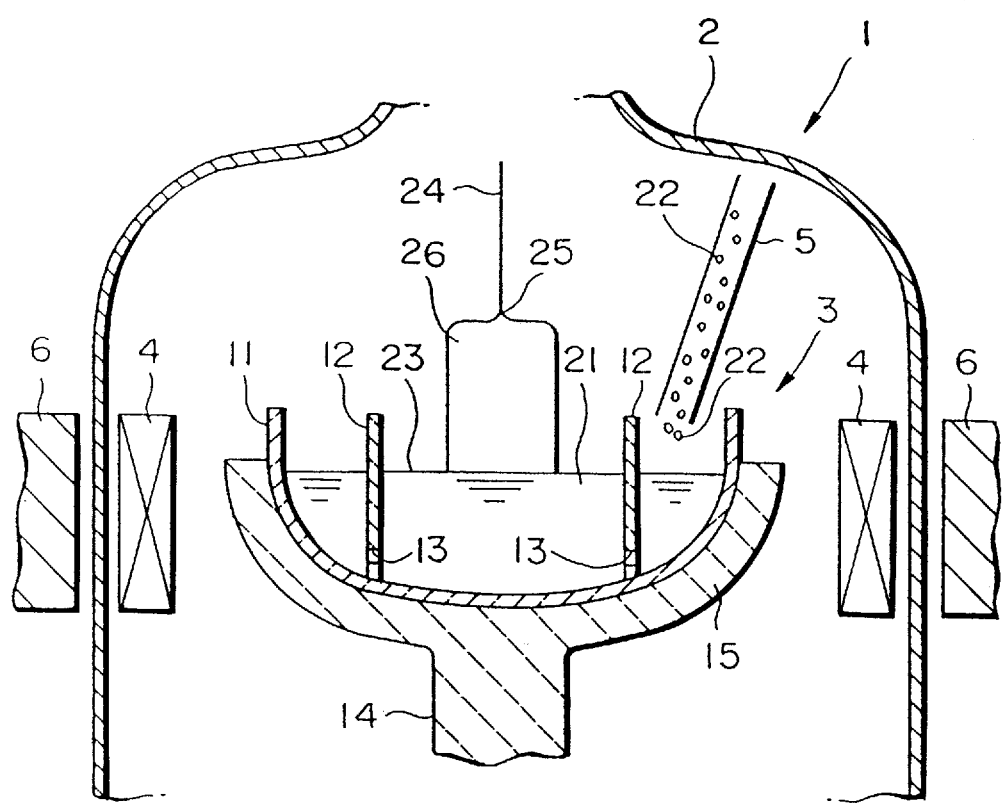
FIG. 2 is a cross-sectional view showing one example of a single crystal pulling apparatus.
Figure 3:
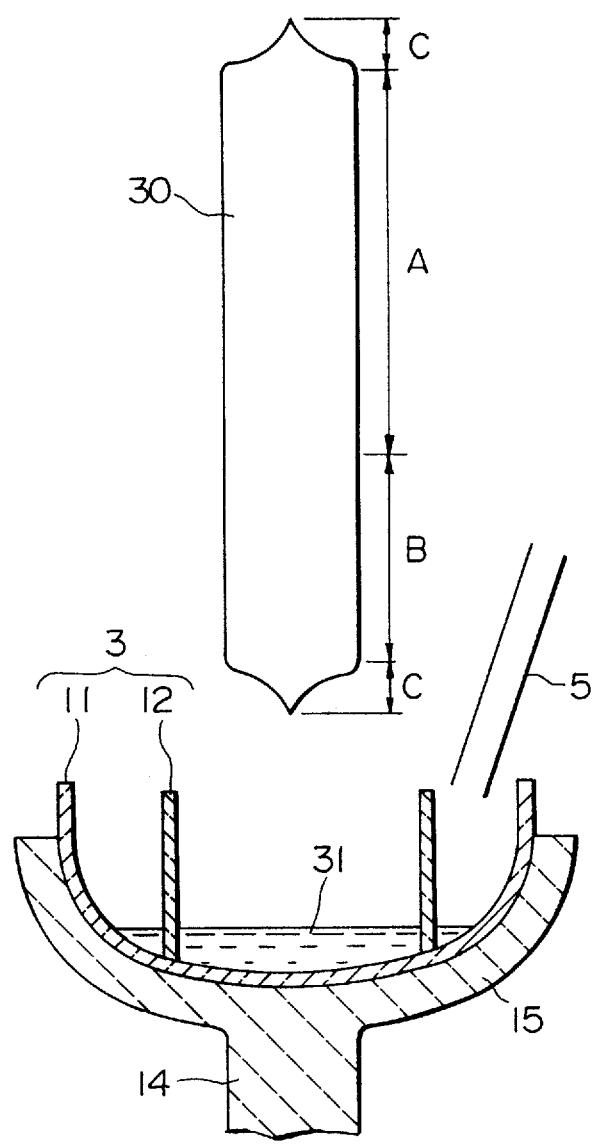
FIG. 3 is a schematic diagram showing a representation of a single crystal of semiconductor, grown in an experimental example according to the first embodiment of a single crystal growth method of the present invention.

The first embodiment of the single crystal growth method of the present invention, employs a single crystal pulling apparatus like that shown in FIG. 2, and allows production of a single crystal of semiconductor 30 like that shown in FIG. 3.

The single crystal of semiconductor 30, consists of a portion A which is formed through a CMCZ growth technique, a variety of the CCZ growth technique, a portion B which is formed through the normal CZ growth technique, and two end portions C, C.

Next, as a first example, is a description of the growing of a silicon semiconductor single crystal using the single crystal growth method of the present embodiment, with reference to FIG. 2.

[Initial source material melting step]

First, a predetermined amount of a polycrystalline source material such as lumps of polysilicon is placed inside an outer crucible 11, and a chamber 2 evacuated using a vacuum pump, or the like, to produce a vacuum. Next, an inert gas such as argon (Ar) is introduced into the chamber 2, and while an outer crucible 11 is rotated at a predetermined angular velocity by rotating a shaft 14 in a horizontal plane about its axis at a predetermined angular velocity, a heater 4 is activated, and the polycrystalline source material inside the outer crucible 11 heated to a temperature exceeding the single crystal growing temperature to melt the source material completely, thus producing the initial semiconductor melt (not shown in the figure).

[Double crucible formation step]

After the source material has melted completely, the heat being applied by the heater 4 is reduced slightly, and an inner crucible 12 is lowered into a semiconductor melt 21 and mounted on to the outer crucible 11 concentric therewith, forming a double crucible 3.

[First step in the single crystal growing process (with CMCZ growth technique)] (0<t<t1)

Following formation of the double crucible 3, an electric current is passed through a magnet 6, applying a magnetic field of predetermined strength, electrical power to the heater 4 is adjusted so as to maintain the surface temperature in the vicinity of a middle area 23 of the semiconductor melt 21 at the single crystal growing temperature, and after a seed crystal 25, which is suspended from a pulling shaft 24 is contacted with the semiconductor melt 21, a single crystal of semiconductor is grown around the seed crystal 25. In this case, following preparation of a seed crystal which is free of dislocation, the diameter of the single crystal is gradually increased to produce a single crystal of semiconductor 26 of specified diameter.

In this single crystal growing process, granulated silicon source material 22 is supplied continuously at a constant supply rate which is proportional to the growth rate (pull rate) of the single crystal of semiconductor 26, as shown in FIG. 1A, and dopants are added either continuously or intermittently as required. The additional source material 22 and dopant, melts in the region between the outer crucible 11 and the inner crucible 12 (the source material melting region), and passes through connecting apertures 13, to be supplied continuously to the inside of the inner crucible 12.

[Intermediate transition step in the single crystal growing process (with CMCZ growth technique)] (t1<t<t2)

Following the generation of a single crystal of semiconductor 26 of specified length, the amount of source material 22 supplied is reduced to zero over a small time interval (t1<t <t2) as shown in FIG. 1A. During this step, it is preferable if the double crucible 3 is lifted at a rate proportional to the rate of reduction in the amount of source material 22 being supplied, so that the surface level 23 of the semiconductor melt 21 is maintained at a constant level. In so doing, the positional relationship of the heater 4 relative to the melt surface is maintained at a constant level, and so the temperature conditions of the semiconductor melt at the melt surface are also constantly maintained.

[Second step in the single crystal growing process (normal CZ growth technique)] (t2<t <t3)

Next, as shown in FIG. 1A, with the supply of source material 22 halted, the step of pulling the single crystal of semiconductor 26 from the residual melt generated by the intermediate transition step is conducted. During this step, it is preferable if the double crucible 3 is lifted so that the surface level 23 of the semiconductor melt 21 is maintained at a constant level. In so doing, the positional relationship of the heater 4 relative to the melt surface is maintained at a constant level, and so the temperature conditions of the semiconductor melt at the melt surface are also constantly maintained.

Using the steps outlined above, a single crystal of semiconductor 30 (shown in FIG. 3) can be grown.

With the single crystal growth method described above, rather than completing the operation with the CCZ growth technique, which leaves a large volume residual melt, the operation is completed with the normal CZ growth technique which leaves little residual melt, and so the volume of the residual melt at the completion of the pulling process can be reduced, and the utilization rate of the source material 22 can be increased, thus improving productivity.

[Second embodiment]

This embodiment differs from the first embodiment described above only in the source material supply pattern, with all other factors being the same.

Figure 1B:
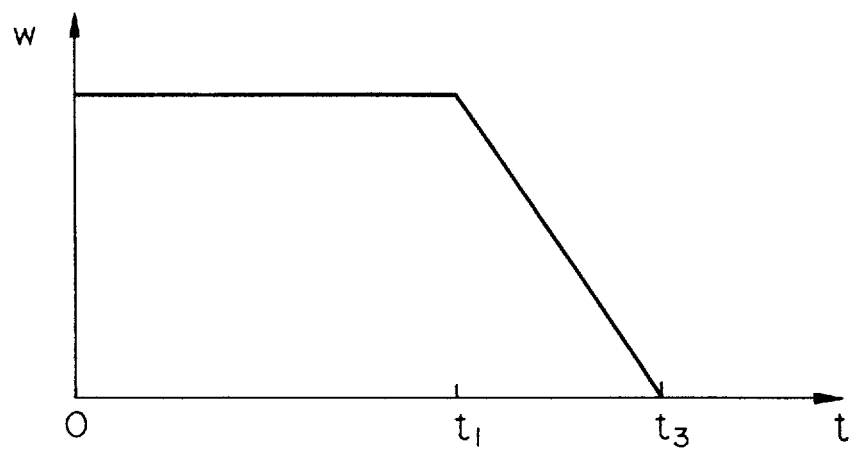

In this embodiment the supply of the source material 22 follows the source material supply pattern shown in FIG. 1B.

Next is a description of a single crystal growth method of this embodiment, but the initial source material melting step, the double crucible formation step, and the first step in the single crystal growing process (with CMCZ growth technique, 0<t<t1) are the same as described above, and so their description is omitted.

[Third step in the single crystal growing process (with CMCZ growth technique)] (t1<t <t3)

Following the generation of a single crystal of semiconductor 26 of specified length, the amount of source material 22 supplied is gradually reduced, and in the case of this embodiment, reduced proportionally over time, as shown in FIG. 1B, so that the amount of supply reaches zero at the point where a single crystal of predetermined diameter has been obtained. During this step, the amount of added dopant is reduced in proportion to the reduction in the amount of source material supplied, which allows any variation in the amount of segregation due to the reduction in the semiconductor melt volume to be taken into consideration, and enables compensation for any fluctuations in the concentration of impurities.

With this step also, during pulling, it is preferable if the double crucible 3 is lifted, so that the surface level 23 of the semiconductor melt 21 is maintained at a constant level. In so doing, the positional relationship of the heater 4 relative to the melt surface is maintained at a constant level, and so the temperature conditions of the semiconductor melt at the melt surface are also constantly maintained.

Using the steps outlined above, a single crystal of semiconductor can be grown.

In this embodiment, the volume of the residual melt remaining at the completion of the pulling process can be reduced by pulling a single crystal of semiconductor using a CMCZ growth technique, where the amount of source material 22 supplied is gradually reduced. Furthermore, by reducing the amount of dopant supplied in proportion to the reduction in the amount of source material 22 supplied, fluctuations in the concentration of impurities, caused by factors such as segregation, can be compensated for, and so the concentration of impurities can be maintained at a constant level, thus enabling stabilization of the quality of the single crystal of semiconductor.

Next is a description of an experimental example based on the above first embodiment and some comparative examples.

[Experimental example based on the first embodiment]

Using a single crystal growth method based on the first embodiment described above, a single crystal of semiconductor 30 like that shown in FIG. 3 was obtained. In this experiment, the weights of the various portions were as listed below.

"Total weight of source material Wt"

Weight of the initial melt: 65 kg

Weight of source material supplied from the source material supply device 5 during the first step: 65 kg Thus Wt=130 kg "Effective product weight W1"

Portion A grown using the CMCZ growth technique: 65 kg

Portion B grown using the normal CZ growth technique: 35 kg

Thus W1=100 kg

"Unavailable weight W2"

The end portions C consisting of the top end (the portion obtained during the pulling commencement transition step) and the bottom end (the portion obtained during the pulling completion transition step): 5 kg each end, total 10 kg The residual melt 31 (shown in FIG. 3): 20 kg Thus W2=30 kg Consequently, the semiconductor source material utilization rate is W1/Wt=approx. 77%, almost four fifths.

[Comparative example 1]

Figure 4:
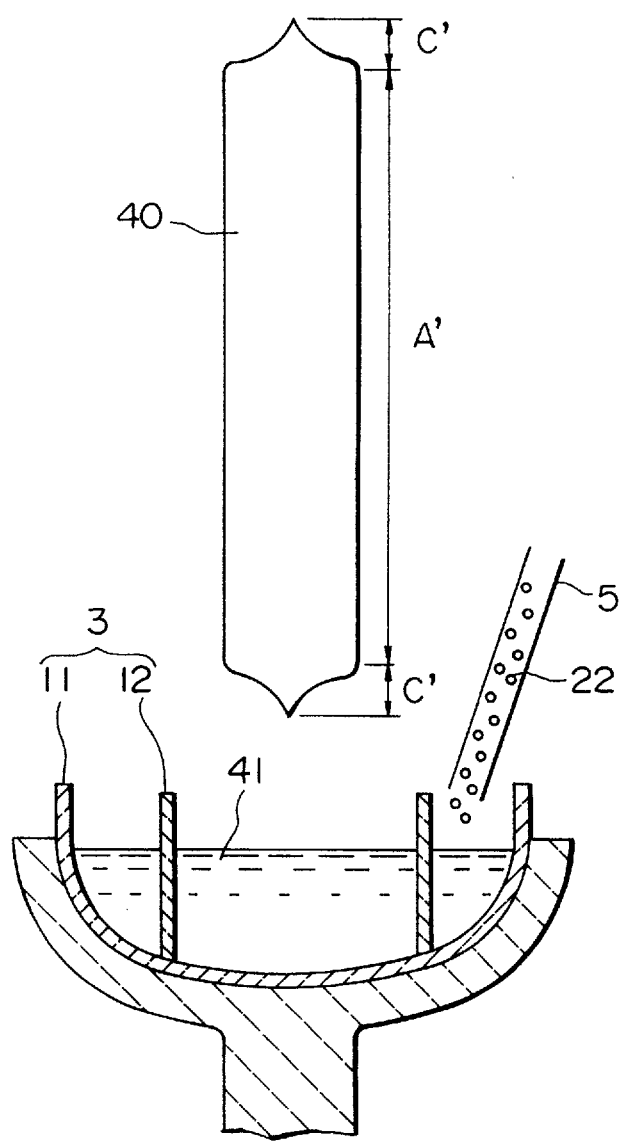
FIG. 4 is a schematic diagram showing a representation of a single crystal of semiconductor, grown using a conventional single crystal pulling method.

Instead of the single crystal growth method outlined above, the crystal pulling was conducted using only the CMCZ growth technique, and a single crystal of semiconductor 40 like that shown in FIG. 4 was obtained. In this experiment, the weights of the various portions were as listed below.

"Total weight of source material Wt"

Weight of the initial melt: 65 kg

Weight of source material supplied from the source material supply device 5 during the first step: 100 kg Thus Wt=165 kg "Effective product weight W1"

Portion A' grown using the CMCZ growth technique: 100 kg

Thus W1=100 kg

"Unavailable weight W2"

The end portions C': 5 kg each for the top end and the bottom end, total 10 kg

The residual melt 41 (shown in FIG. 4): 55 kg

Thus W2=65 kg

Consequently, the semiconductor source material utilization rate is W1/Wt=approx. 61%, or about three fifths.

Comparison with the experimental example above shows clearly that the volume of the residual melt 41 is large, and the semiconductor source material utilization rate is low.

[Comparative example 2]

Figure 5:
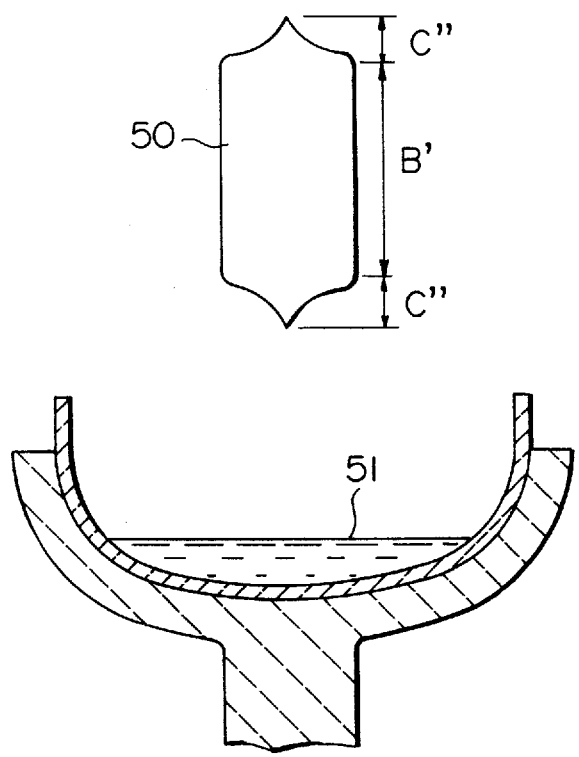
FIG. 5 is a schematic diagram showing a representation of a single crystal of semiconductor, grown using another conventional single crystal pulling method.

Differing from either of the single crystal growth methods above, the single crystal pulling was conducted using only the normal CZ growth technique, and a single crystal of semiconductor 50 like that shown in FIG. 5 was obtained. In this experiment, the weights of the various portions were as listed below.

"Total weight of source material Wt"

Weight of the initial melt: 65 kg

Thus Wt=165 kg

"Effective product weight W1"

Portion B' grown using the normal CZ growth technique: 35 kg

Thus W1=35 kg

"Unavailable weight W2"

The end portions C': 5 kg each for the top end and the bottom end, total 10 kg

The residual melt 51 (shown in FIG. 5): 20 kg

Thus W2=30 kg

Consequently, the semiconductor source material utilization rate is W1/Wt=approx. 54%.

Comparison with the experimental example above, shows clearly that the semiconductor source material utilization rate is low.

In the case of this second comparative example, by increasing the weight of the initial melt to 130 kg, it is possible to obtain a semiconductor source material utilization rate similar to that of the experimental example, but in order to do so, it would be necessary to use a large diameter very deep quartz crucible, which raises such problems as increased cost of the components required for the growing process, and large variations in the concentration of oxygen and impurities in the pulling direction.

The single crystal growth method of the present invention produces the following effects.

In one of the embodiments of the present invention, rather than completing the single crystal pulling operation with the CCZ growth technique, which leaves a large volume of residual melt, the operation is completed with the normal CZ growth technique which leaves little residual melt, and so the final residual melt left at the completion of the pulling process can be reduced, and the utilization rate of the source material can be increased, thus improving productivity.

In the other embodiment of the present invention, the volume of the residual melt remaining at the completion of the pulling process can be reduced by pulling a single crystal of semiconductor using a CCZ growth technique, where the amount of source material supplied is gradually reduced. Furthermore, by reducing the amount of dopant supplied in proportion to the reduction in the amount of source material supplied, fluctuations in the concentration of impurities, caused by factors such as segregation, can be compensated for, and so the concentration of impurities can be maintained at a constant level, thus enabling stabilization of the quality of the single crystal of semiconductor.

In the above embodiments, by using techniques which allow the height of the melt surface to be maintained at a constant height during the single crystal pulling processes, the positional relationship of the heater relative to the melt surface can be maintained at a constant level, and so the temperature conditions of the semiconductor melt at the melt surface are also constantly maintained, enabling stabilization of the quality of the single crystal of semiconductor.

Finally, the present application claims the priority of Japanese Patent Application No. Hei-8-4406 filed Jan. 12, 1996, which is herein incorporated by reference.

What is claimed is:

1. A method of growing a single crystal of semiconductor using a CZ growth technique, having a first step wherein a single crystal of semiconductor is pulled while a source material is supplied continuously to maintain a constant amount of semiconductor melt, and a second step wherein the supply of source material is halted, and the single crystal of semiconductor is pulled using residual melt from said first step.

2. A method of growing a single crystal of semiconductor according to claim 1, wherein in said second step, a surface level of the melt is maintained at a constant level.

3. A method of growing a single crystal of semiconductor according to claim 2, wherein an intermediate transition step where the amount of source material being supplied is reduced until it eventually reaches zero, is inserted between said first and second steps.

4. A method of growing a single crystal of semiconductor according to claim 3, wherein in said intermediate step, a surface level of the melt is maintained at a constant level.

5. A method of growing a single crystal of semiconductor according to claim 1, wherein an intermediate transition step where the amount of source material being supplied is reduced until it eventually reaches zero, is inserted between said first and second steps.

6. A method of growing a single crystal of semiconductor according to claim 5, wherein in said intermediate step, a surface level of the melt is maintained at a constant level.

7. A method of growing a single crystal of semiconductor according to claim 1, having instead of said second step, a third step for pulling a single crystal of semiconductor wherein the amount of source material being supplied is gradually reduced, and said third step is carried out from after completion of said first step and until a constant diameter portion of a single crystal of semiconductor has been pulled.

8. A method of growing single crystals of semiconductor according to claim 7, wherein in said third step, a surface level of the melt is maintained at a constant level.

* * * * *

UNITED STATES PATENT AND TRADEMARK OFFICE
CERTIFICATE OF CORRECTION

PATENT NO.     : 5,840,115
DATED          : November 24, 1998
INVENTOR(S)    : TAGUCHI, et al.

It is certified that error appears in the above-identified patent and that said Letters Patent is hereby corrected as shown below:

On the title page, item [73] Assignee, should read--

MITSUBISHI MATERIALS SILICON CORPORATION, TOKYO, JAPAN
MITSUBISHI MATERIALS CORPORATION, TOKYO, JAPAN

--.

Signed and Sealed this

Tenth Day of August, 1999

Attest:

Q. TODD DICKINSON

*Attesting Officer*     *Acting Commissioner of Patents and Trademarks*